United States Patent [19]

Kumada et al.

[11] Patent Number: 4,938,244

[45] Date of Patent: Jul. 3, 1990

[54] TEMPERATURE DIFFERENCE DETECTING ELEMENT USING SEMICONDUCTIVE CERAMIC MATERIAL

[75] Inventor: Akira Kumada; Michihiro Murata; Norimitsu Kitoh, all of Kyoto, Japan

[73] Assignee: Murata Manufacturing Co., Ltd., Japan

[21] Appl. No.: 253,719

[22] Filed: Oct. 5, 1988

[30] Foreign Application Priority Data

Oct. 5, 1987 [JP] Japan .................................. 62-251345
Oct. 5, 1987 [JP] Japan .................................. 62-251347
Oct. 5, 1987 [JP] Japan .................................. 62-251348
Oct. 5, 1987 [JP] Japan .................................. 62-251349

[51] Int. Cl.⁵ .............................................. H01L 35/28
[52] U.S. Cl. ...................................... 136/212; 136/225; 136/232; 136/239; 136/240; 136/241
[58] Field of Search .......... 136/212, 225, 232, 239–241

[56] References Cited

U.S. PATENT DOCUMENTS

| | | | |
|---|---|---|---|
| 3,885,992 | 5/1975 | Wilcox | 136/212 |
| 3,899,359 | 8/1975 | Stachurski | 136/205 |
| 3,899,360 | 8/1975 | Bredt et al. | 136/238 |
| 3,943,553 | 3/1976 | Elfving et al. | 136/212 X |
| 3,981,751 | 9/1976 | Dashevsky et al. | 136/212 X |
| 4,049,469 | 9/1977 | Kolomoets et al. | 136/225 |
| 4,125,122 | 11/1978 | Stachurski | 136/205 |
| 4,306,426 | 12/1981 | Berthet et al. | 62/3 |
| 4,489,742 | 12/1984 | Moore et al. | 136/203 |

FOREIGN PATENT DOCUMENTS 53-21202 2/1978 Japan .

Primary Examiner—Peter A. Nelson
Attorney, Agent, or Firm—Ostrolenk, Faber, Gerb & Soffen

[57] ABSTRACT

A temperature difference detecting element utilizing thermoelectromotive force which is generated by a Seebeck effect when temperature gradients are applied to a semiconductive ceramic material. A substrate has a plurality of thermoelements. Each thermoelement comprises a semiconductive ceramic material and a pair of hot-side and cold-side electrodes which are provided on the semiconductive ceramic material with a prescribed spacing, to form a hot junction and a cold junction respectively. A plurality of such hot-side electrodes are arranged on a first region of the substrate to be adjacent to each other, while a plurality of such cold-side electrodes are arranged on a second region of the substrate to be adjacent to each other. The plurality of thermoelements are sequentially connected in series with each other by electrically connecting, for example, the hot-side electrodes of the thermoelements with the cold-side electrodes of those adjacent thereto. A slit or an electrical insulating material part may be provided between each adjacent pair of electrodes, that is, between each pair of hot-side electrodes and each pair of cold-side electrodes, to increase the electrical resistance therebetween and thereby to increase the output voltage of the element as a whole.

16 Claims, 5 Drawing Sheets

TEMPERATURE DIFFERENCE DETECTING ELEMENT USING SEMICONDUCTIVE CERAMIC MATERIAL

BACKGROUND OF THE INVENTION

1. Field of the Invention

The present invention relates to a temperature difference detecting element utilizing a Seebeck effect, and more particularly, it relates to a temperature difference detecting element which has an improved arrangement of its thermoelements.

2. Description of the Prior Art

Japanese Patent Laying-Open Gazette No. 114090/1979 discloses a thermal detector employing semiconductor thermoelements made of reducing titanium oxide. As shown in FIG. 11, this thermal detector is formed by a plurality of thermoelements, each of which comprises a plate type semiconductor substrate 1 of reducing titanium oxide provided with ohmic metal films 2a and 2b on one major surface thereof. A hot junction 3 and a cold junction 4 are defined between the semiconductor substrate 1 and the ohmic metal films 2a and 2b. FIG. 11 is a plan view of three thermoelements 6a, 6b and 6c, which are connected in series with each other by lead wires 7 and 8 to provide an integrated thermal detector.

Its output voltage can be increased by connecting the plurality of thermoelements 6a, 6b and 6c in series with each other as shown.

In order to obtain the thermal detector shown in FIG. 11, however, it is necessary to separately prepare the thermoelements 6a to 6c, which must be alternately arranged in opposite directions as shown in FIG. 11 and then connected in series with each other via the lead wires 7 and 8. Thus, the steps of manufacturing the thermal detector are complicated.

SUMMARY OF THE INVENTION

Accordingly, an object of the present invention is to provide a temperature difference detecting element, which can be obtained through simpler steps to enable simplification of the entire structure.

Another object of the present invention is to provide a temperature difference detecting element having higher sensitivity.

The temperature difference detecting element according to the present invention is provided with a plurality of thermoelements comprising semiconductive ceramic material which generates thermoelectromotive force based on a Seebeck effect. Such thermoelements are arranged in a single substrate longitudinally along a major surface of the substrate. Each thermoelement comprises a semiconductive ceramic material and a pair of respective hot-side and cold-side electrodes which are provided on the semiconductive ceramic material with a prescribed spacing to form hot and cold junctions respectively. A plurality of such hot-side electrodes and a plurality of such cold-side electrodes are provided independently of each other. The plurality of hot-side electrodes are arranged on a first region of the substrate to be adjacent to each other. The plurality of cold-side electrodes are arranged on a second region of the substrate which is opposite to the first region to be adjacent to each other. The hot-side electrodes of the thermoelements are electrically connected with the cold-side electrodes of the thermoelements adjacent thereto so that the plurality of thermoelements are sequentially electrically connected in series with each other by conductive paths.

In a preferred embodiment of the present invention, a substrate is integrally formed of a semiconductive ceramic material. Hot-side electrodes, cold-side electrodes and conductive paths are formed on at least one major surface of the substrate. Thus, a plurality of thermoelements are defined by respective parts of the semiconductive ceramic material forming the substrate, and are connected in series with each other by the conductive paths. According to this embodiment, therefore, a temperature difference detecting element of a multistage series connection type can be obtained with a single semiconductive ceramic substrate. Thus, the entire structure of the element can be simplified since there is no need to electrically and mechanically combine a plurality of substrates with each other, as is required in the conventional element. Further, no alignment or adhesion of a plurality of substrates is required, whereby manufacturing steps can be simplified as compared with a conventional semiconductive ceramic thermo pile of a multistage series connection type.

The temperature difference detecting element according to the present invention can be employed in an infrared detector, for example, to implement a small thermo pile type infrared detector having high output voltage.

In the aforementioned preferred embodiment of the present invention, a slit is preferably defined in the substrate between at least one adjacent pair of at least either the hot-side or cold-side electrodes. Such a slit is adapted to greatly increase electrical resistance across the electrodes located on both sides of the slit. A resistance which may be developed in a semiconductive ceramic part between two thermoelements holding such a slit is not added to the output of the thermoelements as a heavy load, whereby reduction of the output from the thermoelements can be prevented. Thus, a highly sensitive temperature difference detecting element can be implemented.

In order to attain an effect similar to that of the aforementioned slit, a substrate of another preferred embodiment of the present invention a laminated structure of semiconductive ceramic parts and electrical insulating material parts which are alternately stacked in the longitudinal direction of its major surface. Hot-side electrodes and cold-side electrodes are formed on the semiconductive ceramic parts. In this embodiment, the insulating material parts can be prepared from an electrically insulative ceramic material, so that the semiconductive ceramic parts and the insulating material parts are mechanically fixed to each other by cofiring the semiconductive ceramic material and the electrically insulative ceramic material.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
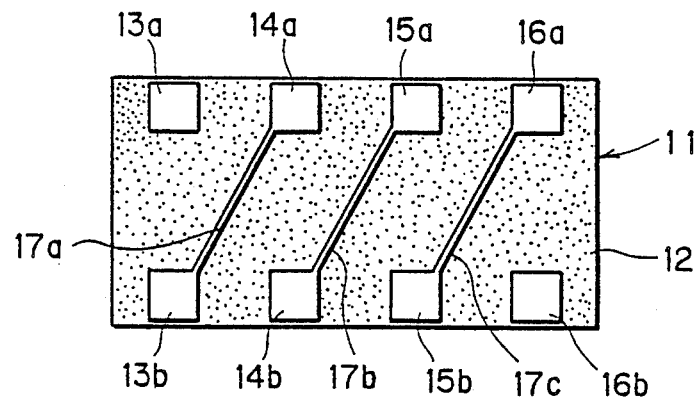
FIG. 1 is a plan view showing a temperature difference detecting element according to an embodiment of the present invention.
Figure 2:
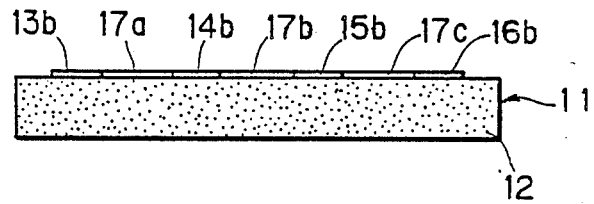
FIG. 2 is a front elevational view of the temperature difference detecting element shown in FIG. 1.
Figure 11:
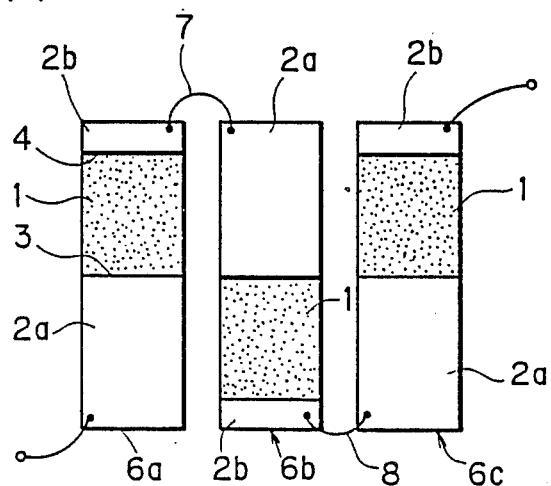
FIG. 11 is a schematic plan view for illustrating an example of a conventional thermal detector.

Referring to FIGS. 1 and 2 showing an embodiment of the present invention, a temperature difference detecting element 11 is formed by a substrate 12 of semiconductive ceramic. The substrate 12 may be prepared from an n-type semiconductive ceramic material which is selected from the group consisting of perovskite semiconductor such as $BaTiO_3$ or $SrZrO_3$, ilmenite semiconductor such as $MnTiO_3$, spinel semiconductor such as $Fe_3O_4$ or $MnFe_2O_4$, tungsten bronze semiconductor such as $Pb_xNb_2O_6$ and other semiconductor such as $ZrO$, $TiO_2$ or $V_2O_5$. Alternatively, the substrate 12 may be prepared from a p-type semiconductive ceramic material such as $Cu_2O$, $NiO$, $CoO$, $FeO$, $MnO$, $LaMnO_3$, $NiMnO_3$ or $LaFeO_3$. The n-type semiconductive ceramic material may be utilized as excess semiconductor which has been treated in a reducing atmosphere, while the p-type semiconductive ceramic material may be utilized as deficit semiconductor which has been treated in an oxidizing atmosphere. Further, the n-type semiconductive ceramic material may be utilized as valency control semiconductor which is formed by adding a rare earth element such as La, Ce, Pr or Nd or an oxide such as $TiO_2$, $ZrO$ or $CdO$. In the case of the p-type semiconductive ceramic material, valency control semiconductor may be formed by adding an oxide such as $SrO$, $CaO$ or $Li_2O$.

A plurality of electrodes 13a to 16a and 13b to 16b are formed on one major surface of the substrate 12. The electrodes 13a to 16a are distributed along an edge extending in the longitudinal direction on the said major surface of the substrate 12. On a corresponding plurality of other hand, the electrodes 13b to 16b are distributed along another edge of the said major surface of the substrate 12 so as to be opposite to the electrodes 13a to 16a. In other words, four pairs of electrodes 13a and 13b, ..., and 16a and 16b are formed with prescribed spaces therebetween on the said major surface of the substrate 12.

In this embodiment, a thermoelement is defined by each pair of the aforementioned electrodes, e.g., 13a and 13b, and a part of the semiconductive ceramic substrate 12 located between the electrodes 13a and 13b. Thus, four thermoelements are defined in the entire substrate 12.

Either the grouped electrodes 13a to 16a or the grouped electrodes 13b to 16b are adapted to form hot junctions. The other group is adapted to form cold junctions. Although either group may form hot or cold junctions, it is assumed here that the electrodes 13a to 16a form hot junctions in association with the substrate 12 while the electrodes 13b to 16b form cold junctions, for convenience of illustration. Thus, it is understood that the four thermoelements are so arranged in the rectangular substrate 12 that the electrodes forming hot or cold junctions thereof are adjacent to each other.

The thermoelements are electrically connected with each other by connecting conductive paths 17a to 17c which are provided on the substrate 12. Thus, the four thermoelements are connected in series with each other, as the result.

The electrodes 13a to 16b can be formed of a metal material which provides ohmic contact, such as nickel, aluminum, gold or indium or an alloy of such metals, by a thick film forming method such as printing or a thin film forming method such as vapor deposition or sputtering. The connecting conductive paths 17a to 17c can preferably be simultaneously prepared with the electrodes 13a to 16b from the same material. However, the connecting conductive paths 17a to 17c may be formed of a conductive material which is different from that of the electrodes 13a to 16b. Further, the conductive paths 17a to 17c may be prepared from a metal material which provides non-ohmic contact with the semiconductive ceramic material.

In the embodiment shown in FIGS. 1 and 2, the temperature detecting element 11 is provided with the four thermoelements which are connected in series with each other in the single semiconductive ceramic substrate 12. Thus, it is understood that the entire thickness of such an element can be effectively reduced by employing a thin substrate. Further, no lamination or adhesion is required since the temperature difference detecting element 11 is not formed by stacking a plurality of substrates. In addition, no complicated connecting operation is required since the connecting conductive paths 17a to 17c can be formed simultaneously with the electrodes 13a to 16b.

Although a rectangular semiconductive ceramic substrate 12 is employed in the embodiment shown in FIGS. 1 and 2, it is also possible to use a semiconductive ceramic substrate having another plane configuration. For example, a disc type semiconductive ceramic substrate may be employed so that a plurality of thermoelements radially extend on the semiconductive ceramic substrate and are connected in series with each other.

Additional electrodes for forming thermoelements may be provided on the other major surface of the semiconductive ceramic substrate, so that a plurality of thermoelements are defined on each surface of the semiconductive ceramic substrate. In this case, the thermoelements formed on one of the major surfaces are preferably connected in series with those formed on the other major surface to double the number of connection stages, thereby to obtain higher output voltage.

An experiment made in relation to the above embodiment will now be described.

A semiconductive ceramic plate was prepared from a semiconductorized $BaTiO_3$-system non-reducing material having specific resistance of 29 k$\Omega$ cm and polished with an abrasive of #800, to obtain a substrate 12 of 10×20×0.5 mm in size. This substrate 12 was subjected to ultrasonic cleaning by using demineralized water and isopropyl alcohol in this order. Then, electrodes 13a to 16b were formed on one major surface of the substrate 12 by vapor deposition of depositing Ni first and then depositing Ag thereon at about $10^{-5}$ Torr.

Figure 3:
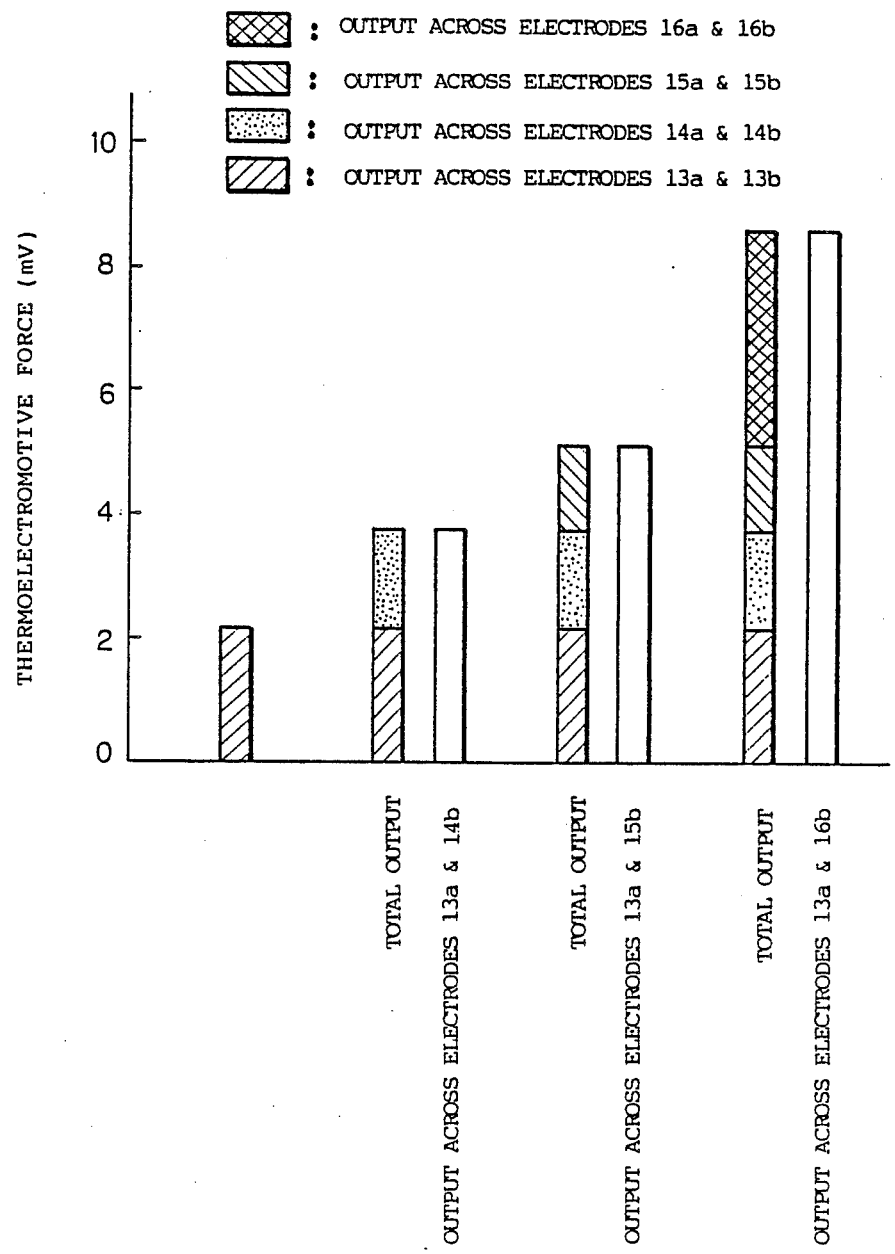
FIG. 3 is a graph showing output obtained by the temperature difference detecting element shown in FIG. 1.

FIG. 3 shows outputs across the respective pairs of electrodes, i.e., those across 13a and 13b, across 14a and 14b, across 15a and 15b and across 16a and 16b, and those across 13a and 14b, across 13a and 15b, and across 13a and 16b measured in the temperature difference detecting element obtained in the aforementioned manner. It is understood from FIG. 3 that the output across the electrodes 13a and 16b is the total sum of those of four thermoelements.

Figure 4:
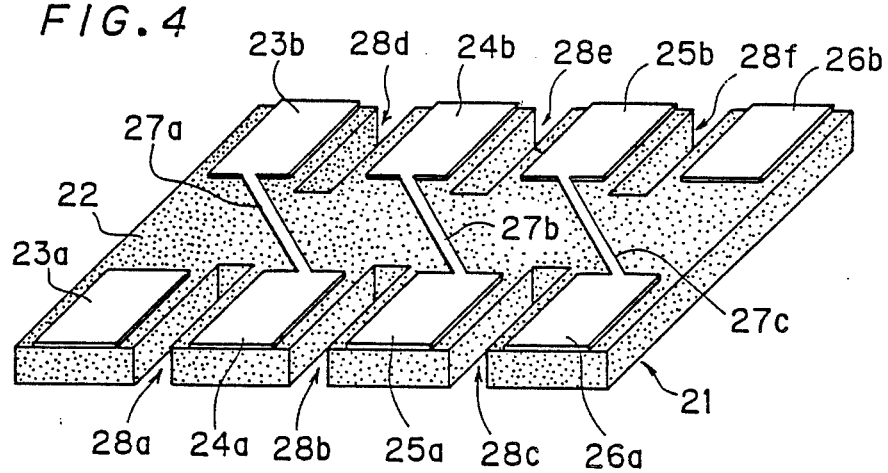
FIG. 4 is a perspective view showing a temperature difference detecting element according to another embodiment of the present invention.

FIG. 4 shows a temperature difference detecting element 21 according to another embodiment of the present invention. Similarly to the embodiment of FIGS. 1-3, the temperature difference detecting element 21 is formed by a semiconductive ceramic substrate 22. A plurality of electrodes 23a to 26a and 23b to 26b are formed on one major surface of the substrate 22. The electrodes 23a to 26a are distributed along a longitudinal edge of the said major surface of the substrate 22. On the other hand, the electrodes 23b to 26b are distributed along the other longitudinal edge of the substrate 22, to be opposite to the electrodes 23a to 26a.

Also in the embodiment shown in FIG. 4, a thermoelement is defined by each pair of electrodes, e.g., 23a and 23b and a part of the semiconductive ceramic substrate 22 located between the electrodes 23a and 23b, similarly to the above embodiment. Further, adjacent thermoelements are so electrically connected with each other by connecting conductive paths 27a to 27c that four such thermoelements are connected in series with each other as the result.

In this embodiment, slits 28a to 28f are defined between adjacent electrodes of the four thermoelements. The slits 28a to 28f are formed by partially notching the substrate 22 inwardly from the longitudinal edges thereof. These slits 28a to 28f are adapted to increase the electromotive output voltage levels of the respective thermoelements. Such function is now described with reference to FIGS. 1, 4, 5 and 6.

Referring again to FIG. 1, consider the aforementioned temperature difference detecting element 11 having no such slits, for reference. The temperature difference detecting element 11 shown in FIG. 1 is substantially similar to the temperature difference detecting element 21 shown in FIG. 4, except that the latter is provided with no slits.

Figure 5:
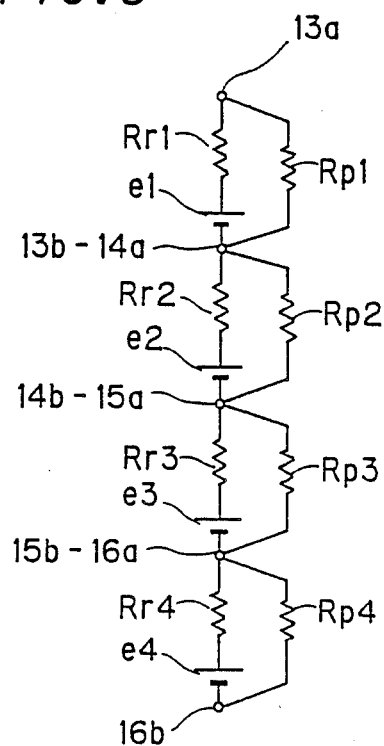
FIG. 5 is an equivalent circuit diagram of the temperature difference detecting element shown in FIG. 1.

FIG. 5 shows an equivalent circuit of the temperature difference detecting element 11 shown in FIG. 1. Referring to FIG. 5, each symbol $R_r$ indicates the substrate resistance between each pair of electrodes in each thermoelement and each symbol $R_p$ indicates the substrate resistance between each pair of the adjacent electrodes forming cold or hot junctions, that is, between adjacent pairs of the thermoelements. The subscripts indicate the respective thermoelements. Accordingly, the potential difference $e_{1,2}$ between the electrode 13a and across the electrodes 13b and 14a, is $e_{1,2}=e_1 \cdot R_{p1}/(R_{r1}+R_{p1})$. Assuming that n thermoelements are formed, the total output $$e_{total} = \sum_{i=1}^{n} e_{i,i-1} = \Sigma[e_i \cdot R_{pi}/(R_{ri} + R_{pi})].$$

Figure 6:
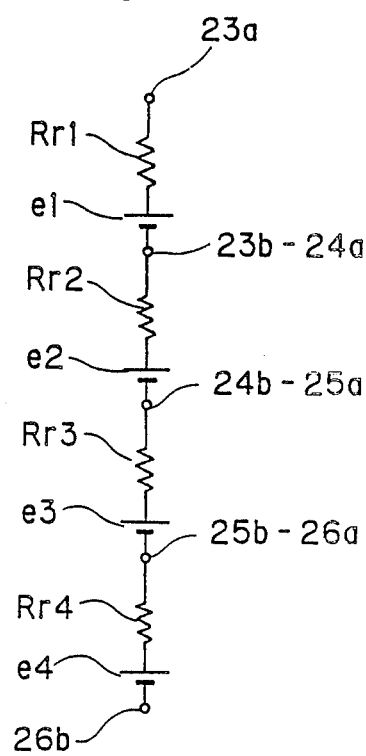
FIG. 6 is an equivalent circuit diagram of the temperature difference detecting element shown in FIG. 4.

In the temperature difference detecting element 21 shown in FIG. 4, on the other hand, the values $R_p$ are greatly larger than $R_r$ since the slits 28a to 28f are defined. Thus, the values $R_p$ are negligible in the equivalent circuit of the temperature difference detecting element 21 as shown in FIG. 6, whereby the output of each thermoelement can be increased, to increase the output of the entire element as the result.

The aforementioned slits 28a to 28f may not necessarily be defined between all of the adjacent electrodes of the adjacent thermoelements as shown in FIG. 4. Such a slit may even be formed between at least one adjacent pair of electrodes, to increase the output.

The slits 28a to 28f are adapted to greatly increase the resistance between the electrodes of the adjacent thermoelements so that the aforementioned values $R_p$ can be disregarded, thereby to increase the output as the result. This effect is still present even if the slits 28a to 28f are filled up with an insulating material. In this case, the substrate 12 is prevented from being reduced in strength because of the formation of the slits 28a to 28f, while the thermal conductivity of the element is still changed.

The slits 28a to 28f are not particularly restricted in configuration, as long as they provide higher resistance levels as compared with the parts of the substrate 12 located between the adjacent electrodes. For example, the slits 28a to 28f may not be open at the longitudinal edges of the substrate 22, but may be provided in the form of closed elongated holes.

In the above embodiment, the slits 28a to 28f are defined in the substrate 22 to increase the electrical resistance developed across the thermoelements, thereby to reduce the output loss due to leakage current between the thermoelements. A similar effect can be attained by employing a substrate having a laminated structure of semiconductive ceramic parts and electrical insulating material parts which are alternately stacked longitudinally along its major surface. Some embodiments having such structure will now be described.

Figure 7:
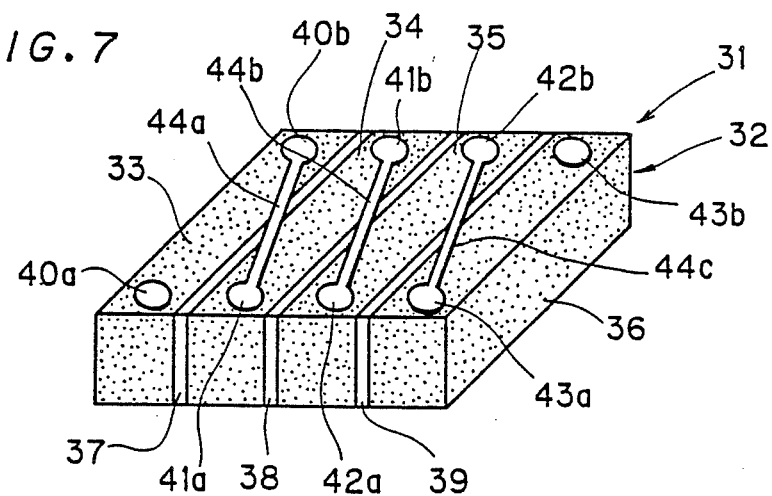
FIG. 7 is a perspective view showing a temperature difference detecting element according to still another embodiment of the present invention.

FIG. 7 shows a temperature difference detecting element 31, which comprises a substrate 32. The substrate 32 has a laminated structure of semiconductive ceramic parts 33 to 36 and electrical insulating material parts 37 to 39 which are alternately stacked longitudinally along its major surface. The semiconductive ceramic parts 33 to 36 are made of a semiconductive ceramic material such as $BaTiO_3$ ceramic. On the other hand, the electrical insulating material parts 37 to 39 are made of insulative ceramic, glass, resin or the like.

Pairs of electrodes 40a and 40b, 41a and 41b, 42a and 42b, and 43a and 43b are respectively formed on the semiconductive ceramic parts 33 to 36 with prescribed spaces therebetween. In this embodiment, the electrodes 40a and 40b, . . . , and 43a and 43b are located on one major surface of the substrate 32 in the vicinity of respective longitudinal ends of corresponding ones of the semiconductive ceramic parts 33 to 36. The electrodes 40a and 40b, . . . , and 43a and 43b are substantially circularly shaped so that the diameters thereof are smaller than the length of the respective semiconductive ceramic parts 33 to 36 in the direction of stacking.

A thermoelement is defined by the semiconductive ceramic part 33 and the pair of electrodes 40a and 40b, for example. Thus, four thermoelements are defined in the entire substrate 32. Either the grouped electrodes 40a to 43a or the grouped electrodes 40b to 43b are adapted to form hot junctions. The remaining ones are adapted to form cold junctions.

The four thermoelements are sequentially electrically connected in series with each other. Therefore, connecting conductive paths 44a, 44b and 44c are formed on the said major surface of the substrate 32 to electrically connect respective hot-side electrodes of the thermoelements with cold-side electrodes of those adjacent thereto.

The temperature difference detecting elements 31 shown in FIG. 7 can implement an equivalent circuit which is substantially similar to that shown in FIG. 6.

An exemplary method of manufacturing the temperature difference detecting element 31 will now be described.

Green sheets of a semiconductive ceramic material are prepared in order to form the semiconductive ceramic parts 33 to 36. On the other hand, green sheets of an insulative ceramic material are prepared in order to form the insulating material parts 37 to 39. The insulative ceramic green sheets and the semiconductive ceramic green sheets are alternately stacked and connected with each other under pressure to obtain a pressure-connected body which, is then cofired. Then, the electrodes 40a and 40b, . . . , and 43a and 43b and the conductive paths 44a to 44c are formed on the fired body, by a thick film printing method or a thin film forming method such as vapor deposition or sputtering. The conductive paths 44a to 44c and the electrodes 40a and 40b, . . . , and 43a and 43b can be simultaneously formed of the same material. By the foregoing steps, the temperature difference detecting element 31 shown in FIG. 7 is obtained.

The insulating material for forming the insulating material parts 37 to 39 is not restricted to being ceramic material, but may be prepared from glass or synthetic resin. When the insulating material is prepared from glass or synthetic resin, the semiconductive ceramic parts 33 to 36 are formed of a previously fired semiconductive ceramic material. Such semiconductive ceramic material members are arranged so as to alternate with those of the insulating material prepared from glass or synthetic resin, and are then thermally treated in this state. After such heat treatment, the insulating material parts 37 to 39, which are formed by the glass or resin material as shown in FIG. 7, are mechanically fixed together with the semiconductive ceramic parts 33 to 36.

Figure 8:
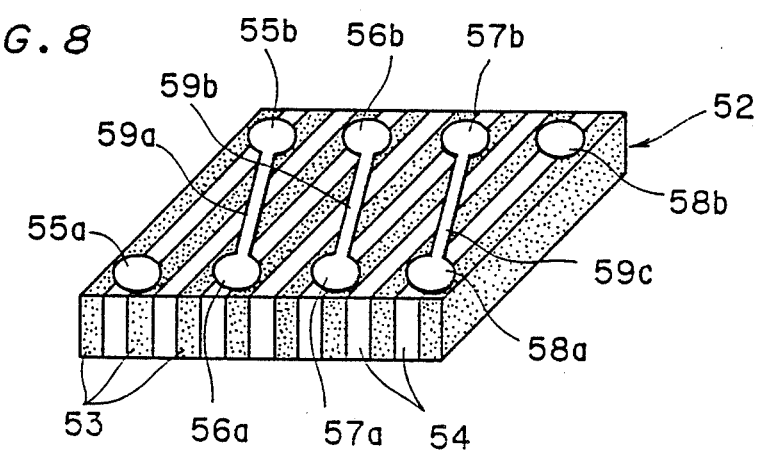
FIG. 8 is a perspective view showing a temperature difference detecting element according to a further embodiment of the present invention.

This embodiment can be modified as shown in FIG. 8, which is a modification of the structure shown in FIG. 7. FIG. 8 shows an embodiment in which the semiconductive ceramic parts are smaller than the electrodes in size along the direction of stacking.

Referring to FIG. 8, a substrate 52 is formed of semiconductive ceramic parts 53 and electrical insulating material parts 54. Particularly, the semiconductive ceramic parts 53 are formed smaller than those shown in FIG. 7 along the direction of stacking. Electrodes 55a and 55b, 56a and 56b, 57a and 57b, and 58a and 58b are formed so as to have diameters larger than the size of the semiconductive ceramic parts 53 along the direction of stacking. Thus, each electrode is provided over an adjacent pair of the semiconductive ceramic parts 53. Three conductive paths 59a, 59b and 59c electrically connect the electrodes 55b to 57b with the electrodes 56a to 58a on the substrate 52 respectively.

Figure 9:
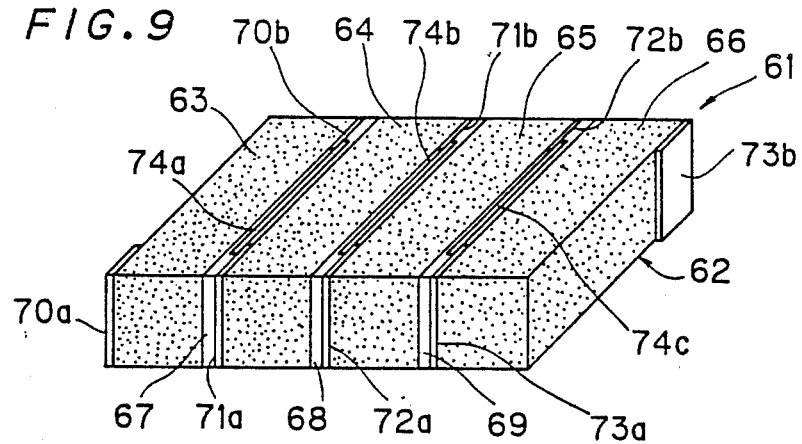
FIG. 9 is a perspective view showing a temperature difference detecting element according to a further embodiment of the present invention.

FIG. 9 shows a further embodiment of the present invention. Referring to FIG. 9, a temperature difference detecting element 61 comprises a substrate 62, which has a laminated structure of semiconductive ceramic parts 63 to 66 and electrical insulating material parts 67 to 69 alternately stacked along the longitudinal direction of its major surface.

Pairs of electrodes 70a and 70b, 71a and 71b, 72a and 72b, and 73a and 73b are respectively formed on the semiconductive ceramic parts 63 to 66 with a prescribed spacing therebetween. In this embodiment, the electrodes 70a and 70b, . . . , and 73a and 73b are located on surfaces of corresponding ones of the semiconductive ceramic parts 63 to 66 which are perpendicular to the direction of stacking. Each pair of electrodes, for example, 70a and 70b, are located on opposite surfaces of the corresponding semiconductive ceramic part 63 in the vicinity of longitudinally opposite end portions.

Thus, a thermoelement is defined by each pair of electrodes, e.g., 70a and 70b, and the corresponding semiconductive ceramic part 63. Thus, four thermoelements are defined in the single substrate 62 in the temperature difference detecting element 61 shown in FIG. 9.

Conductive paths 74a, 74b and 74c are formed within the electrical insulating material parts 67 to 69. The conductive paths 74a to 74c are adapted to electrically connect the hot junction side electrodes of the respective thermoelements with the cold junction side electrodes of the thermoelements adjacent thereto. For example, the conductive path 74a in the electrical insulating material part 67 electrically connects the electrodes 70b and 71a with each other. Thus, the four thermoelements are connected in series with each other by the conductive paths 74a to 74c.

An exemplary method of manufacturing the temperature difference detecting element 61 shown in FIG. 9 will now be described. Green sheets of a semiconductive ceramic material are prepared in order to form the semiconductive ceramic parts 63 to 66. Conductive paste for forming the electrodes 70a and 70b, . . . , and 73a and 73b is applied onto the green sheets by screen printing, for example. On the other hand, green sheets of an insulative ceramic material, which have conductive paste layers for forming the conductive paths 74a to embedded therein, are prepared in order to obtain the electrical insulating material parts 67 to 69. The insulative ceramic green sheets are provided with electrical connecting means such as through holes (not shown), so that the conductive paths 74a to 74c are electrically connected with corresponding ones of the electrodes. In place of such through holes, prescribed portions of the conductive paths 74a to 74c may be exposed on the surfaces of the insulative ceramic green sheets. Then, the aforementioned semiconductive ceramic green sheets and the insulative ceramic green sheets are alternately stacked and connected with each other under pressure. A pressure-connected body is thus obtained. This body is fired, thereby obtaining the temperature difference detecting element 61 shown in FIG. 9.

In place of the ceramic material, the electrical insulating material parts 67 to 69 can be formed of synthetic resin, for example.

Figure 10:
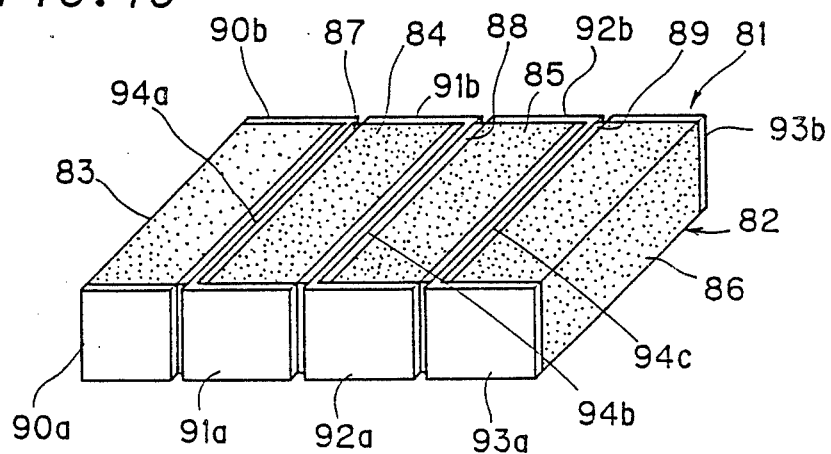
FIG. 10 is a perspective view showing a temperature difference detecting element according to a further embodiment of the present invention.

FIG. 10 shows a further embodiment of the present invention. Referring to FIG. 10, a temperature difference detecting element 81 comprises a substrate 82, which has a laminated structure including semiconductive ceramic parts 83 to 86 and electrical insulating material parts 87 to 89 alternately stacked along the longitudinal direction of its major surface.

In this embodiment, electrodes 90a and 90b, 91a and 91b, 92a and 92b, and 93a and 93b form hot and cold junctions in association with the semiconductive ceramic parts 83 to 86 respectively, on longitudinal end portions of corresponding ones of the semiconductive ceramic parts 83 to 86. A thermoelement is defined by each pair of electrodes, for example, 90a and 90b, and the relating semiconductive ceramic part 83. Thus, four thermoelements are defined in the single substrate 82 in the entire temperature difference detecting element 81.

Conductive paths 94a, 94b and 94c are formed in the electric insulating material parts 87 to 89, in order to connect cold junction side electrodes of the thermoelements with hot junction side electrodes of those adjacent thereto. Thus, the four thermoelements are connected in series with each other by the conductive paths 94a to 94c.

In the embodiment shown in FIG. 10, the electrodes 90a and 90b, ..., and 93a and 93b are formed on longitudinal end surfaces of the semiconductive ceramic parts 83 to 86, which preferably have the geometry shown in FIG. 10. However, semiconductive ceramic parts such as the parts 33 to 36, 53 and 63 to 66 shown in FIGS. 7, 8 and 9 respectively are advantageously smaller along the direction of stacking as compared with the geometry shown in FIG. 10. Therefore, if parts similar to those in FIGS. 7-9 are used, the number of such stacked semiconductive ceramic parts can be increased without increasing the size of the temperature difference detecting element. Thus, the number of the thermoelements connected in series with each other can be increased to further increase output voltage as the result.

Although the present invention has been described and embodiments thereof have been illustrated in detail, it is clearly understood that the embodiments described herein are by way of illustration and example only and are not to be taken by way of limitation, the spirit and scope of the present invention being limited only by the terms of the appended claims.

What is claimed is:

1. A temperature difference detecting element comprising:
    a substrate having two opposite major surfaces, said substrate being an integral plate formed of semiconductive ceramic material and having first and second regions defined therein which are opposite to each other and extend along the longitudinal direction of said two major surfaces, said substrate being associated with a plurality of thermoelements arranged in the longitudinal direction of said major surfaces,
    each said thermoelement comprising a respective portion of the semiconductive ceramic material in said substrate, and a pair of hot-side and cold-side electrodes provided on said semiconductive ceramic material with a prescribed spacing therebetween, forming a hot junction and a cold junction respectively,
    a plurality of said hot-side electrodes and a plurality of said cold-side electrodes being provided independently of each other on said substrate,
    said plurality of hot-side electrodes being arranged on said first region of said substrate adjacent to each other,
    said plurality of cold-side electrodes being arranged on said second region of said substrate adjacent to each other; and
    conductive path means for electrically connecting a hot-side electrode of at least one of said plurality of thermoelements with the cold-side electrode of a thermoelement adjacent thereto, thereby to sequentially electrically connect said plurality of thermoelements in series with each other;
    wherein said hot-side electrodes, said cold-side electrodes and said conductive path means are formed on at least one of said two major surfaces of said substrate.

2. A temperature difference detecting element comprising:
    a substrate having two opposite major surfaces, said substrate having first and second regions defined therein which are opposite to each other and extend along the longitudinal direction of said two major surfaces, said substrate being associated with a plurality of thermoelements arranged in the longitudinal direction of said major surfaces,
    each said thermoelement comprising semiconductive ceramic material and a pair of hot-side and cold-side electrodes provided on said semiconductive ceramic material with a prescribed spacing therebetween, forming a hot junction and a cold junction respectively,
    a plurality of said hot-side electrodes and a plurality of said cold-side electrodes being provided independently of each other on said substrate,
    said plurality of hot-side electrodes being arranged on said first region of said substrate adjacent to each other,
    said plurality of cold-side electrodes being arranged on said second region of said substrate adjacent to each other; and
    conductive path means for electrically connecting a hot-side electrode of at least one of said plurality of thermoelements with the cold-side electrode of a thermoelement adjacent thereto, thereby to sequentially electrically connect said plurality of thermoelements in series with each other;
    wherein said semiconductive ceramic material comprises an n-type semiconductive ceramic material prepared from an oxide which is mainly composed of at least one element selected from the group consisting of Cu, Ba, Sr, Ti, Zr, Ca, Mn, Mo, Mg, Fe, Sn, V, Ni, Co and Cr.

3. A temperature difference detecting element comprising:
    a substrate having two opposite major surfaces, said substrate having first and second regions defined therein which are opposite to each other and extend along the longitudinal direction of said two major surfaces, said substrate being associated with a plurality of thermoelements arranged in the longitudinal direction of said major surfaces,
    each said thermoelement comprising semiconductive ceramic material and a pair of hot-side and cold-side electrodes provided on said semiconductive ceramic material with a prescribed spacing therebetween, forming a hot junction and a cold junction respectively, a plurality of said hot-side electrodes and a plurality of said cold-side electrodes being provided independently of each other on said substrate, said plurality of hot-side electrodes being arranged on said first region of said substrate adjacent to each other, said plurality of cold-side electrodes being arranged on said second region of said substrate adjacent to each other; and conductive path means for electrically connecting a hot-side electrode of at least one of said plurality of thermoelements with the cold-side electrode of a thermoelement adjacent thereto, thereby to sequentially electrically connect said plurality of thermoelements in series with each other;

wherein said semiconductive ceramic material comprises a p-type semiconductive ceramic material prepared from an oxide which is mainly composed of at least one element selected from the group consisting of Cu, Ni, Co, Fe, Mn, Cr, Y, Mo, Tl and La.

4. A temperature difference detecting element in accordance with claim 1, wherein said substrate is provided with a slit in a position between at least one adjacent pair of said electrodes.

5. A temperature difference detecting element comprising:

a substrate having two opposite major surfaces, said substrate having first and second regions defined therein which are opposite to each other and extend along the longitudinal direction of said two major surfaces, said substrate being associated with a plurality of thermoelements arranged in the longitudinal direction of said major surfaces, each said thermoelement comprising semiconductive ceramic material and a pair of hot-side and cold-side electrodes provided on said semiconductive ceramic material with a prescribed spacing therebetween, forming a hot junction and a cold junction respectively, a plurality of said hot-side electrodes and a plurality of said cold-side electrodes being provided independently of each other on said substrate, said plurality of hot-side electrodes being arranged on said first region of said substrate adjacent to each other, said plurality of cold-side electrodes being arranged on said second region of said substrate adjacent to each other; and conductive path means for electrically connecting a hot-side electrode of at least one of said plurality of thermoelements with the cold-side electrode of a thermoelement adjacent thereto, thereby to sequentially electrically connect said plurality of thermoelements in series with each other;

wherein said substrate has a laminated structure comprising semiconductive ceramic material parts and electrical insulating material parts which are alternately stacked in the longitudinal direction of said major surfaces, said hot-side electrodes and said cold-side electrodes being formed on said semiconductive ceramic material parts.

6. A temperature difference detecting element in accordance with claim 5, wherein said conductive path means are formed on at least one of said two major surfaces of said substrate.

7. A temperature difference detecting element in accordance with claim 5, wherein said conductive path means are formed within said insulating material parts.

8. A temperature difference detecting element in accordance with claim 5, wherein said insulating material parts are made of an electrically insulative ceramic material, said semiconductive ceramic parts and said insulating material parts being mechanically fixed to each other by cofiring a semiconductive ceramic material and said electrically insulative ceramic material.

9. A method of manufacturing a temperature difference detecting element comprising the steps of:

providing a substrate comprising a semiconductive ceramic material and having two opposite major surfaces;

forming a plurality of thermoelements arranged in the longitudinal direction of the two opposite major surfaces of said substrate;

each said thermoelement being formed by a pair of hot-side and cold-side electrodes on one major surface of said substrate with a prescribed spacing therebetween, whereby said thermoelements define a plurality of adjacent hot junctions and a plurality of adjacent cold junctions;

wherein said substrate has a laminated structure comprising semiconductive ceramic material parts and electrical insulating material parts which are alternately stacked in the longitudinal direction of said major surfaces, said hot-side electrodes and said cold-side electrodes being formed on said semiconductive ceramic material parts;

said hot-side and cold-side electrodes being formed respectively in opposite first and second regions which extend along the longitudinal direction of said two major surfaces of said substrate; said pluralities of hot-side and cold-side electrodes being respectively adjacent to each other; and electrically connecting said plurality of thermoelements in series with each other by forming a conductive path between the hot-side electrode of at least one thermoelement and the cold-side electrode of an adjacent thermoelement.

10. A method as in claim 9, wherein said laminated structure of said substrate is obtained by:

preparing a plurality of green sheets of a semiconductive ceramic material, in order to form the semiconductive ceramic parts;

preparing a plurality of green sheets of an insulating ceramic material, in order to form the insulating material parts;

alternately stacking the insulating green sheets and the semiconductive green sheets and bonding the same by pressure to form a pressure-bonded body; and then cofiring the pressure-bonded body.

11. A method as in claim 10, wherein the electrodes and the conductive paths are formed on the fired body.

12. A method as in claim 10, wherein the electrodes are formed by applying conductive paste onto green sheets of semiconductive ceramic material.

13. A method as in claim 12, wherein said conductive paste is applied onto the green sheets by screen printing.

14. A method as in claim 10, wherein the conductive paths are formed by embedding conductive paste layers in green sheets of insulating ceramic material.

15. A method as in claim 14, wherein selected portions of the conductive paths are exposed at the surfaces of the insulating ceramic green sheets.

16. A method as in claim 15, wherein the electrodes are formed by applying conductive paste to green sheets of semiconductive ceramic material;
 then said green sheets of semiconductive material are alternately stacked with said green sheets of insulating material, and said sheets are bonded by pressure to form a pressure-bonded laminated body; and
 then said laminated body is fired.

* * * * *